(12) United States Patent
Hofmann et al.

(10) Patent No.: US 8,526,098 B2
(45) Date of Patent: Sep. 3, 2013

(54) MICROSYSTEM AND METHOD FOR THE PRODUCTION OF A MICROSYSTEM

(75) Inventors: Ulrich Hofmann, Itzehoe (DE);
Hans-Joachim Quenzer, Itzehoe (DE);
Marten Oldsen, Hamburg (DE)

(73) Assignee: Fraunhofer-Gesellschaft zur Förderung der angewandten Forschung e.V. (DE)

( * ) Notice: Subject to any disclaimer, the term of this patent is extended or adjusted under 35 U.S.C. 154(b) by 403 days.

(21) Appl. No.: 12/669,333

(22) PCT Filed: Jul. 10, 2008

(86) PCT No.: PCT/EP2008/006070
§ 371 (c)(1),
(2), (4) Date: Jun. 29, 2010

(87) PCT Pub. No.: WO2009/010309
PCT Pub. Date: Jan. 22, 2009

(65) Prior Publication Data
US 2010/0296151 A1    Nov. 25, 2010

(30) Foreign Application Priority Data
Jul. 16, 2007 (DE) .......................... 10 2007 034 888

(51) Int. Cl.
*G02B 26/00* (2006.01)
(52) U.S. Cl.
USPC ......................................... 359/291
(58) Field of Classification Search
USPC ................. 359/290–292, 295, 220, 223, 224, 359/237
See application file for complete search history.

(56) References Cited

U.S. PATENT DOCUMENTS 5,872,880 A * 2/1999 Maynard .......................... 385/88
5,920,417 A * 7/1999 Johnson ..................... 359/223.1
(Continued)

FOREIGN PATENT DOCUMENTS

DE    10 200 6061 763 A1    7/2007
DE    10 2006 061 762 A1    7/2007
EP    1804110 A1    7/2007

OTHER PUBLICATIONS

"International Application Serial No. PCT/EP2008/006070, Search Report and Written Opinion (German)", (Nov. 6, 2008), 13 pgs.

(Continued)

*Primary Examiner* — Tuyen Tra
(74) *Attorney, Agent, or Firm* — Schwegman Lundberg & Woessner, P.A.

(57) ABSTRACT

The invention relates to a microsystem having at least one micromirror (1) and at least one micromirror actuator (2) for pivoting the at least one micromirror (1) about at least one axis from a relaxed resting position, comprising a frame chip and a transparent cover (3) disposed on the frame chip, wherein the frame chip has a chip frame (10), on which the at least one micromirror (1) is articulated in an elastically pivoting manner, wherein the at least one micromirror (1) is further disposed within the chip frame (10) and in a cavity (11) that is formed between the transparent cover (3) and a carrier layer. To this end, the at least one micromirror (1) is articulated on a frame (14) pivotally about the at least one axis, the frame (14) in turn being pivotally articulated on the chip frame (10), wherein the frame (14) is permanently pivoted out of a chip plane defined by the carrier layer such that the micromirror (1) in the resting position thereof is tilted about a non-pivoting angle relative to the chip plane. The invention further relates to a method for the production of such a microsystem.

16 Claims, 6 Drawing Sheets

(56) References Cited

U.S. PATENT DOCUMENTS

Figure 1:
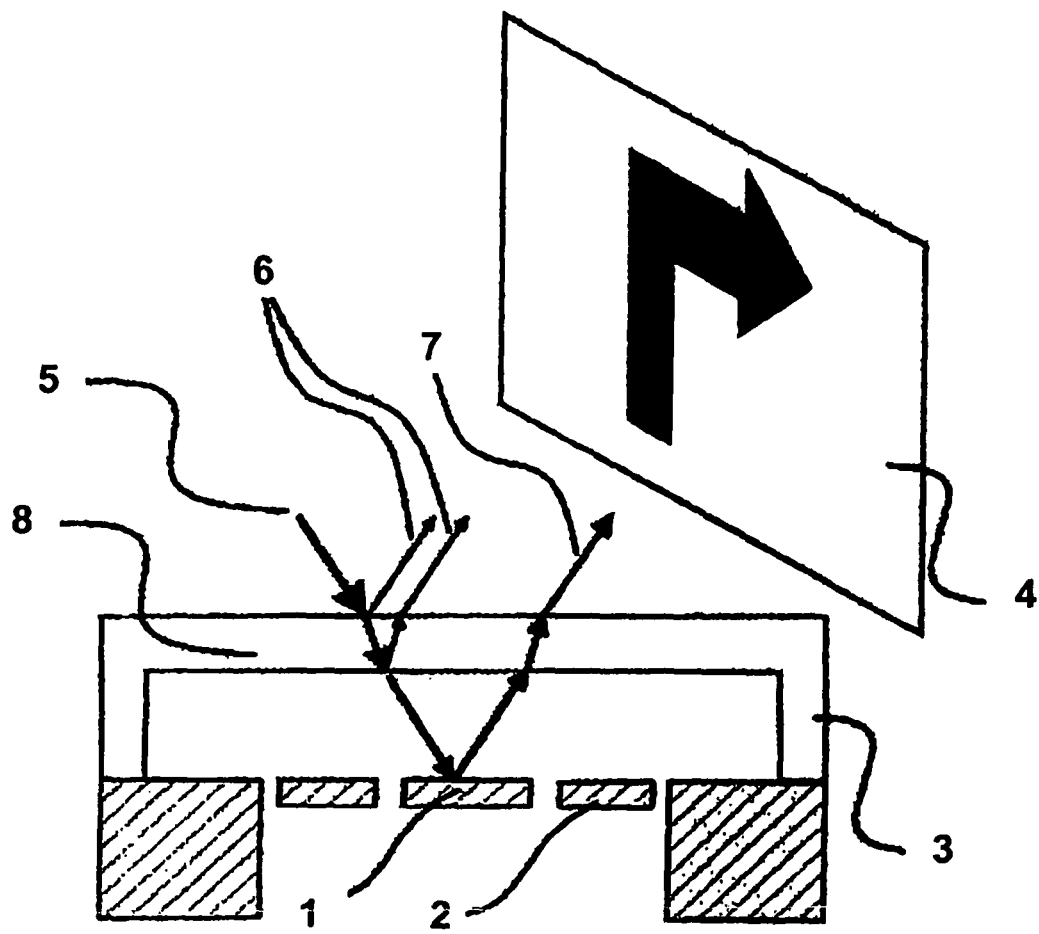

| | | |
|---|---|---|
| 6,295,154 B1 | 9/2001 | Laor et al. |
| 6,426,013 B1 | 7/2002 | Neukermans et al. |
| 6,600,851 B2 * | 7/2003 | Aksyuk et al. .................. 385/18 |
| 7,432,629 B2 * | 10/2008 | Mala et al. .................... 310/309 |
| 7,872,395 B2 * | 1/2011 | Kurozuka et al. ............. 310/309 |
| 7,978,388 B2 * | 7/2011 | Uchiyama et al. ......... 359/199.2 |
| 2004/0218877 A1 | 11/2004 | Xie |
| 2008/0239531 A1 | 10/2008 | Schenk et al. |
| 2008/0242049 A1 | 10/2008 | Jung et al. |

OTHER PUBLICATIONS

"International Application Serial No. PCT/EP2008/006070, International Preliminary Report on Patentability mailed Jan. 19, 2010", 9 pgs.

"International Application No. PCT/EP2008/006070, English Translation of International Preliminary Report on Patentability mailed Feb. 9, 2010", 10 pgs.

* cited by examiner

MICROSYSTEM AND METHOD FOR THE PRODUCTION OF A MICROSYSTEM

PRIORITY CLAIM TO RELATED APPLICATIONS

This application is a national stage application under 35 U.S.C. §371 of PCT/EP2008/006070, filed Jul. 10, 2008, and published as WO 2009/010309 A1 on Jan. 22, 2009, which claims priority to German Application No. 10 2007 034 888.8, filed Jul. 16, 2007, which applications and publication are incorporated herein by reference and made a part hereof in their entirety, and the benefit of priority is claimed thereto.

The invention relates to a microsystem having at least one micromirror and at least one micromirror actuator for pivoting the at least one micromirror according to the preamble of the main claim and also to a method for the production of a corresponding microsystem according to the preamble of the coordinated claim.

Microsystems of this type are known as MOEMS and are used for example in microscanners or projectors.

Ready-processed electromechanical and optoelectromechanical microsystems (MEMS and MOEMS) which are designed typically as micromechanical silicon components frequently comprise very sensitive freely moveable structures (acceleration sensors, rotation rate sensors, micromirrors etc.). Whilst most of the manufacturing steps required for production (e.g. layer deposition, photolithography, etching methods) are implemented in a state in which the microstructures are still connected securely and consequently immovably to the wafer substrate, there is required from this time, since the structure is freely moveable by means of a so-called "release" process, particular protection of the microstructure from environmental influences, e.g. from particle contamination, condensation, mechanical overloading and contact with liquids. In particular when separating a wafer, the wafer surface comes in contact typically with particles and water. In order to be able to manufacture MEMS products economically with a high yield, it is attempted both to implement the "release" step and the protection of the exposed structure already at a wafer level, i.e. before separation. Most suitable is a so-called wafer-level packaging method in which the MEMS component is closed in a separate cavity on all sides. The MEMS wafer is thereby connected to a further cover wafer, if required in addition also to a base wafer. In many cases, it is required that the cover wafer has a cavity in order that the moveable microstructure is situated at a specific spacing relative to the cover wafer. Since these cover or base wafers frequently comprise silicon, cavities can be produced easily and precisely by well controlled etching methods. The entire composite comprising a plurality of wafers can subsequently be separated without impairing the functionality of the MEMS component. Examples of such a wafer-level packaging method are described for example in the publication U.S. Pat. No. 6,743,656 B2.

In the case where the micromechanical component performs an optical function, for example if a microscanning mirror is involved as described for example in DE 199 41 363 B4, then an optically transparent cover of corresponding optical quality is required. In the light-optical field, a cover made of glass or a similarly transparent material would therefore be required. Insofar as the functionality of the micromechanical structure is restricted not solely to movements in the wafer- or chip plane, but also provides movements perpendicular thereto, out of this plane, a correspondingly deep cavity is required above and below the MEMS component. If the MEMS component concerns for example a mirror actuator with a torsional suspension, the mirror diameter and the maximum deflection angle determine the stroke of the actuator perpendicularly out of the wafer- or chip plane and hence at the same time the depth of the cavities which is required in order to ensure that the actuator does not impact unintentionally.

In the publication U.S. Pat. No. 6,822,326 B2 a method is described with which a wafer-level package of MEMS structures can be produced with an optical glass cover. Hence a hermetically sealed package is produced for surface-micromechanical structures which require a protective cover wafer only on one side.

In the publication WO 2004/068665 A2, a wafer-level packaging method for optoelectrical components is described, which method provides a glass cover of optical quality. The described method provides that the wafer which comprises the components to be encapsulated is firstly separated and only then placed on, mounted, contacted and finally encapsulated on a new carrier wafer. The central problem of protecting a fragile MEMS component from too great mechanical loading, particularly during the separation, cannot be achieved herewith. The required cavity which forms the spacing between glass surface and active component is achieved in that firstly a further wafer provided with recesses is applied as spacer on the component wafer and only then is the glass wafer with optical quality connected to the already existing wafer stack.

In the publication U.S. Pat. No. 6,146,917 A, a wafer-level packaging method for MEMS components is described, in which a silicon or glass wafer provided with cavities is connected either by fusion bonding or anodic bonding to the MEMS wafer so that a hermetic package is produced. The description of the method is restricted to surface micromechanically manufactured MEMS wafers which have no channel structures penetrating completely through the wafer. As a result, the method manages without additional connection of the wafer composite to a further base wafer. It is described that the production of the 50 to 150 µm deep cavities in a silicon wafer can be achieved by wet-chemical etching in KOH solution. The same can also be transferred to glass wafers. Generally a glass cover produced in this way is no longer suitable for optical purposes of use because of too great roughness and unevenness. Optical applications are not singled out as a topic in this patent document.

In the publication U.S. Pat. No. 5,591,679 A, a method for the production of a hermetic package both of surface micromechanically and volume micromechanically manufactured MEMS components is described. In the case of surface micromechanical structures, a glass cover wafer which is provided with cavities and which is bonded anodically to a silicon MEMS wafer thus suffices. For volume micromechanically produced sensors and actuators, a glass base wafer is also provided in addition to a glass cover wafer. The method is not directed at optical applications. It is not described in more detail how the cavity in the glass wafer is produced. It must therefore be assumed that the latter has no optical quality.

In the publication US 2005/0184304 A1, a wafer-level packaging method for packaging surface micromechanically manufactured micromirror arrays is presented. A glass wafer shown there has cavities which can serve as optical windows and also have corresponding blooming coats. This cavity wafer with optical windows is bonded in any manner to the wafer with micromirror arrays. Reference is made to a possible cavity depth of 100 micrometers. In the described manner, the method is not suitable for the hermetic encapsulation of volume micromechanically produced micromirrors. It is not explained either how it can be ensured with very deep cavities that the optical quality of the optical window is always achieved.

In addition to the requirements, mentioned here already, on a wafer-level package for MEMS and MOEMS, a further important requirement occurs in general with MOEMS, e.g. if the MOEMS to be packaged concern micromirrors which are intended to be used for laser projection applications.

The light beam to be deflected and directed towards the mirror (in most cases a laser beam) must firstly radiate through the optical window of the package surrounding the mirror actuator. Undesired reflections respectively are thereby produced at the optical interfaces of the glass, which reflections can be in fact reduced by antireflection coatings but are never completely suppressed. In particular for image projection, but also for many further applications, such direct reflections are particularly problematic since they greatly overradiate the projected image information permanently in a stationary manner.

This applies in particular for common generic microsystems which comprise a carrier chip, a frame chip and a transparent cover disposed on the frame chip, the frame chip having a chip frame on which the at least one micromirror is articulated in an elastically pivotable manner, the at least one micromirror being disposed furthermore within the chip frame and in a cavity formed between the transparent cover and a carrier layer.

The object therefore underlying the present invention is to configure such a microsystem such that disrupting effects of reflections occurring on the transparent cover are avoided, the microsystem being intended in addition to be producible with as low complexity as possible. Furthermore, the object underlying the invention is to propose a simple production method for such an advantageous microsystem.

This object is achieved according to the invention by a microsystem having the characterising features of the main claim in conjunction with the features of the preamble of the main claim and also by a method having the features of the coordinated claim. Advantageous embodiment and developments of the invention are revealed in the features of the sub-claims.

As a result of the fact that the at least one micromirror is articulated pivotably on a frame about the at least one axis, which frame is, for its part, articulated pivotably on the chip frame, the frame being pivoted permanently out of a chip plane defined by the carrier layer so that the micromirror is tilted in its resting position by a non-zero angle relative to the chip plane, it is achieved in a simple manner that radiation reflected on the cover is deflected into a direction other than radiation reflected by the at least one micromirror. As a result, it can be avoided in turn, in a very simple manner, that reflections occurring on the cover have a disrupting effect in an image produced by means of the at least one micromirror. The term used here "frame" should not thereby be understood such that the frame would necessarily require to surround the at least one micromirror. The frame concerns a bearing element which articulates pivotably on the chip frame, on which element in turn the micromirror is articulated elastically pivotably about the at least one axis. Thus the frame can have a U-shaped configuration for example or be surrounded by two webs, between which the micromirror is disposed elastically pivotably.

The proposed method, which is advantageously simple and not subject to disruption, for the production of a microsystem in which, by means of structuring a frame chip, a chip frame having at least one micromirror which can be pivoted about at least one axis elastically in the chip frame and can be actuated by at least one micromirror actuator is produced and the chip frame is connected on one side to a transparent cover, correspondingly provides that the at least one micromirror is configured articulated pivotably about the at least one axis on a frame which is articulated pivotably on the chip frame and in that the frame is pivoted, at the latest during closure of the microsystem, permanently out of a chip plane defined by a carrier layer so that the micromirror obtains a resting position tilted relative to the chip plane by a non-zero angle.

The method can be configured as a MEMS packaging method which can fulfil in particular the following requirements:

In the method, surface- and volume micromechanical components can be encapsulated hermetically even at a wafer level.

With the method, cavities can be produced in a glass cover wafer forming the cover, which cavities have depths of e.g. between 500 µm and 900 µm which are adjustable by processing technology, in order that in particular mono- and multiaxial microscanning mirrors with diameters of 500 µm to at most 10 mm can achieve sufficiently large movement amplitudes during torsional movements about the resting position. For example a 10 mm large mirror thus requires, during tilting by 10°, a cavity depth of approx. 900 micrometers.

The method also offers the possibility of specifically setting a defined atmosphere or vacuum in the package.

As a result of the proposed wafer-level packaging method, each MEMS component can be provided with a transparent window of high optical quality. In particular the flatness and plane-parallelism of the optical window can thereby be configured such that unevenness do not exceed a quarter of the wavelength used. In the case of blue light of 440 nm, this corresponds to a boundary value of 110 nm. The square roughness Rq of the produced optical window should therefore not exceed a value of 5 nm.

Finally, the method makes it possible that the reflections of an incident light beam to be deflected, which can never be completely suppressed, are situated outwith the scanning range of the micromirror.

The proposed invention can be produced in a simple manner with a microactuator which is tilted specifically mechanically for the purpose of improving optical properties. Preferably, this pretilting is achieved during a wafer-level packaging processing.

The carrier layer, in typical embodiments of the invention, is formed by a separate carrier chip on which the frame chip is disposed.

The transparent cover typically comprises a window which is disposed above the at least one micromirror and has two plane-parallel surfaces which are orientated parallel to the chip plane. As a result, a particularly simple production is possible, in which the cover can also be produced on a wafer basis.

The frame can be retained in a simple manner by at least one base which is disposed between the carrier layer and the frame or between the frame and the transparent cover in its position pivoted out of the chip plane.

The mentioned non-zero angle should preferably be greater than a maximum deflection angle of the at least one micromirror out of the resting position in order that reflections on the cover, even during maximum deflection of the micromirror, do not interfere. This angle can be, in preferred embodiments of the invention, at least 2°, particularly preferably at least 4°, even better at least 6°.

The frame can be pivoted out of the chip plane in a simple construction with well-arranged geometry about a pivot axis which is orientated parallel to the axis or one of the axes about which the at least one micromirror is designed to be elastically pivotable.

In preferred embodiments of the invention, the at least one micromirror actuator comprises at least one rigid electrode comb which is disposed on the frame, and at least one pivotable electrode comb which is connected to the micromirror. The micromirror can thus be actuated precisely and easily. The at least one micromirror can thereby be connected to the frame in a simple manner by means of at least one torsion spring.

The frame in turn can be connected to the chip frame via an elastic suspension which preferably comprises at least one spiral spring or at least one torsional articulation.

The proposed method which is suitable for production of a microsystem of the portrayed type can provide that the carrier layer is formed by a separate carrier chip which is connected to the frame chip such that the carrier chip comes to be situated on a side of the frame chip situated opposite the transparent cover.

In the method, the frame can be pivoted out of the chip plane in a simple manner by at least one base which is disposed on the carrier layer or on the transparent cover or on the frame. For this purpose, the carrier layer or the transparent cover or the frame chip can be provided by any normal structuring method with the at least one base.

A preferred embodiment of the method provides that the carrier layer and/or the frame chip and/or the transparent cover are manufactured on the basis respectively of one wafer on which at the same time further, typically similar, microsystems are produced, the wafer or wafers only being separated when the microsystem is closed by connecting the frame chip to the transparent cover. Connection of the frame chip to the cover and typically also to the carrier chip takes place therefore typically by bonding of the corresponding wafers which are only then separated to form the corresponding—already connected—chips. When closing the microsystem and the further microsystems produced on the wafers, these are therefore present typically also as two-dimensional matrix. This configuration of the method has the great advantage that particles produced during the separation can no longer penetrate into the microsystems and thus no longer cause damage.

Embodiments of the invention are described subsequently with reference to FIGS. 1 to 9. There are shown FIG. 1 a cross-section through a microsystem having a micromirror according to the state of the art, FIG. 2 a perspective view of a frame chip for a microsystem in an embodiment of the invention, FIG. 3 a cross-section through the frame chip having a transparent cover and a carrier chip before closure of the microsystem resulting therefrom, FIG. 4 likewise as cross-section, the finished microsystem in the mentioned embodiment of the invention, FIG. 5 in the representation corresponding to FIG. 3, another embodiment of the invention, FIG. 6 a representation, corresponding to FIG. 4, of the finished microsystem in the embodiment of the invention of FIG. 5, FIG. 7 a detailed perspective representation of a frame chip for a microsystem in a further embodiment of the invention, FIG. 8 the frame chip of FIG. 7 in another deflection of a micromirror disposed in the centre in the frame chip, in a corresponding representation and FIG. 9 again in corresponding representation, the frame chip from FIGS. 7 and 8 in relaxed state.

In FIG. 1, the problem of reflections of an input beam 5 is represented for a microsystem according to the state of the art, having an encapsulated microactuator 2, a mirror plate of a micromirror 1, in the resting state, being parallel to the plane-parallel surfaces of an optical window 8. The optical window 8 is thereby part of a transparent cover 3 serving for the encapsulation. An output beam 7 reflected on the micromirror 1 extends parallel to the undesired but unavoidable reflections 6 of the input beam 5. Consequently, the result is disruptive overlaps in a projection surface 4.

In the embodiments of the invention represented in FIGS. 2 to 9 and described subsequently in more detail or components of corresponding microsystems, recurring features are always characterised with the same reference numbers.

In order to prevent as represented in FIG. 1, the reflections 6 of the incident light beam 5 to be scanned (in most cases provided by a laser beam), which is produced when impinging on the optically transparent plane-parallel cover 3 of the micromirror actuator 2, from impinging upon the solid angle range of the beam 7 deflected at the micromirror 1 and hence from interfering with the quality of the image projected onto the projection surface 4, the invention provides a specific permanent mechanical pretilting of the micromirror actuator 2. This pretilting, as long as it concerns a 1D actuator, should preferably take place about an axis of rotation which is parallel to the axis of rotation of the microactuator 2. In the case where it concerns a 2D actuator, the pretilting should preferably take place about an axis of rotation which is parallel to one of the two axes of rotation of the microactuator. However, basically tilting about an axis of rotation which extends non-parallel to one of the microactuator axes is conceivable, but the result thereby is generally undesired distortions of the projected image region.

Figure 2:
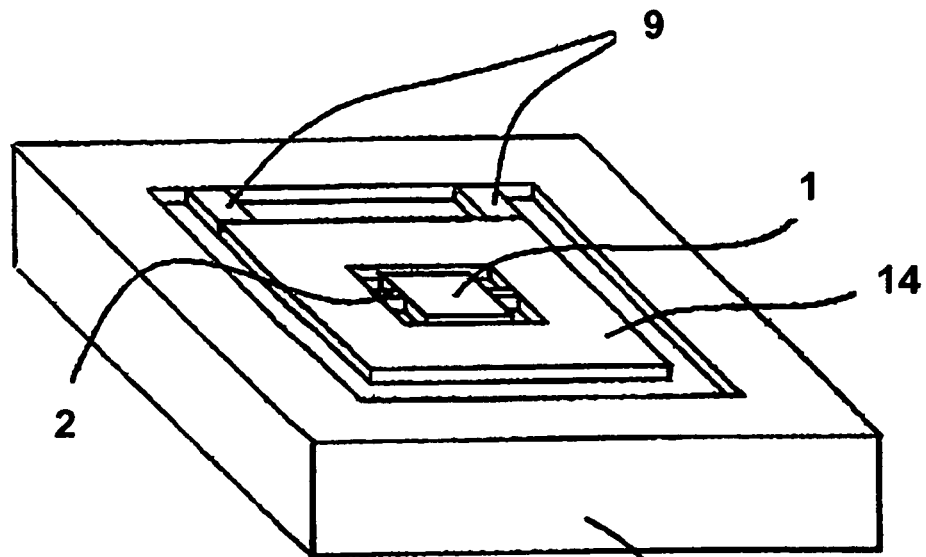

The angle of this pretilting should always be at least slightly greater than the greatest mechanical tilting angle which the micromirror 1 achieves during operation. It is achieved by means of this pretilting that the micromirror 1 is, neither during operation nor in the switched-off state of the microactuator 2, parallel to the plane-parallel surfaces of the optical window 8 of the transparent cover 3 of the microactuator 2. In order to achieve such an inclined position on the wafer plane, i.e. at the same time with each microactuator 2 of the wafer, an additional frame 14, which surrounds the actuator structures at least partially and is suspended elastically on the solid chip frame 10, is provided firstly in the design of the microactuator 2, in which additional frame, for its part, the microactuator 2 is suspended in a suitable manner. It is thereby of no significance whether the micromirror actuator 2 is mono- or multiaxial. As a result of a specific force effect, this frame 14 surrounding the microactuator 2 can be deflected elastically out of the wafer plane. Such a degree of freedom for the elastic pretilting can be achieved for example by suitable torsional articulations and/or (as shown in FIG. 2) with suspensions 9 of the frame 14 which are formed by spiral springs and which are already provided in the design of the microchip which is termed here frame chip and comprises a chip frame 10 on which the frame 14 is articulated pivotably. The micromirror 1 is in turn articulated on this frame 14 elastically pivotable about at least one axis.

In order to achieve the pretilting during the wafer-level packaging method, either a wafer forming the cover or a carrier wafer which forms a carrier chip 13 for each of the resulting microsystems, can be provided, fitting within each chip field respectively with at least one raised base 12 such that the raised base 12, during joining of the wafer forming the cover to a wafer forming the frame chip or during joining of the carrier wafer and the wafer forming the frame chip, abuts against the elastically suspended frame 14 which surrounds the micromirror actuator 2 and the micromirror 1 and hence deflects said frame 14 during assembly. This presupposes that the base 12 has a corresponding height which is greater than the spacing between carrier wafer and microactuator 2. Preferably, the pretilting of the frame 14 is produced by a raised base 12 which is situated not above but below the useful optical surface (here the micromirror 1), because the raised base 12 thus does not restrict the optically usable angle range. The base 12 standing on the carrier wafer and there on the carrier chip 13 can be produced with known methods of silicon microtechnology, for instance by anodic bonding of a silicon wafer on a glass wafer and subsequent structuring (lithography and plasma etching).

The suspension 9 of the frame 14 can be configured geometrically in the most varied of ways but should be configured to be so robust that, both during and after the production process, breakage does not result. Furthermore, care should be taken in the dimensioning of the suspension of the frame 14 that this additional spring suspension does not impair the functionality of the microactuator 2.

Figure 5:
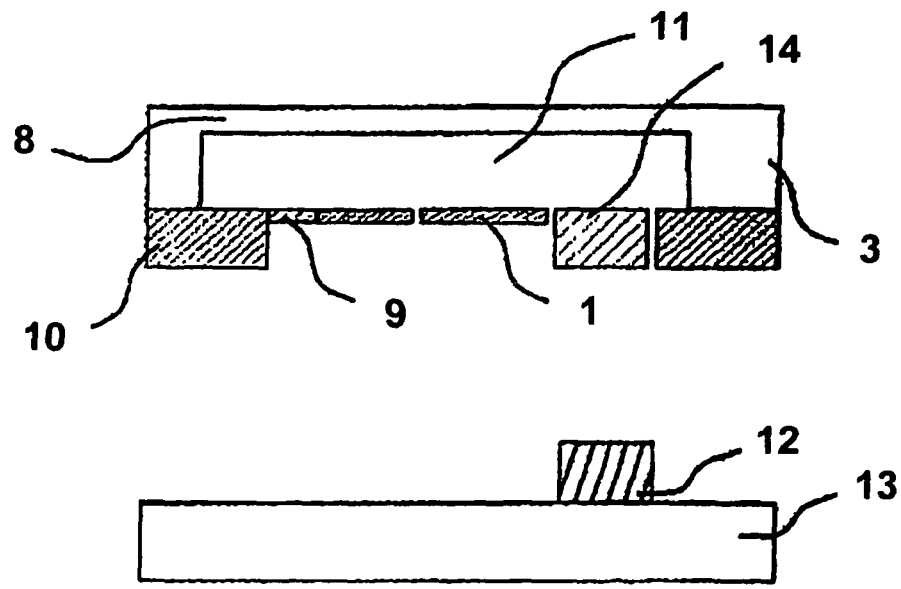
Figure 6:
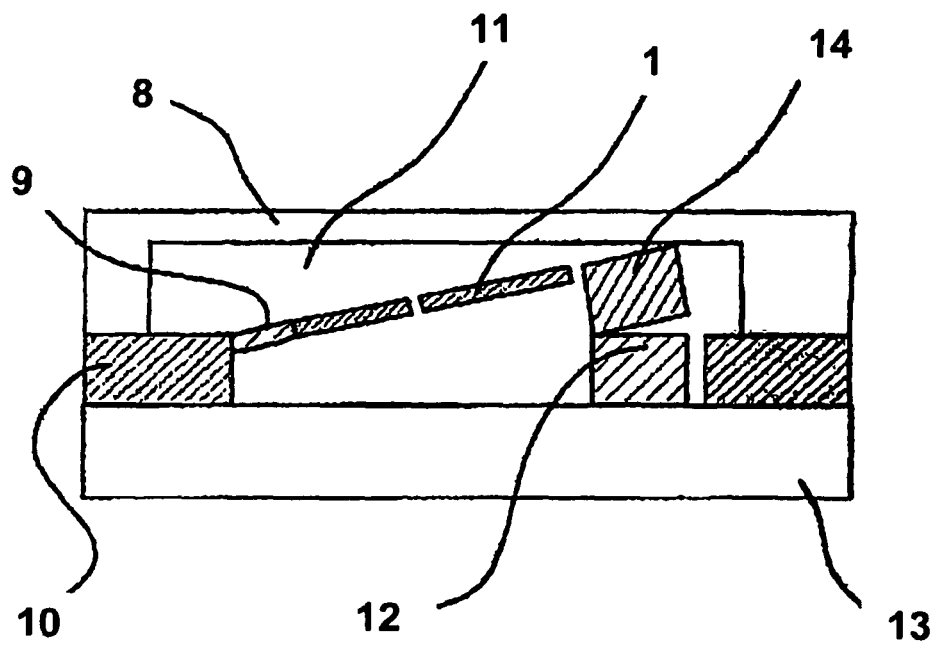

In an advantageous embodiment of the invention, the required height of the raised base 12 can be reduced if the frame 14 to be tilted has, locally at the corresponding position, not the mirror thickness of typically approx. 60 μm but, as shown in FIGS. 5 and 6, the complete wafer thickness of e.g. 500 μm. In this case, a correspondingly smaller height of the raised base 12 suffices in order to deflect the frame 14 in the same manner.

In the embodiment of FIG. 2, the suspension of a monoaxial microactuator 2 in the additional frame 14 is represented in a simplified manner. This frame 14 is, for its part, secured by an elastic suspension 9 on the rigid chip frame 10.

Figure 3:
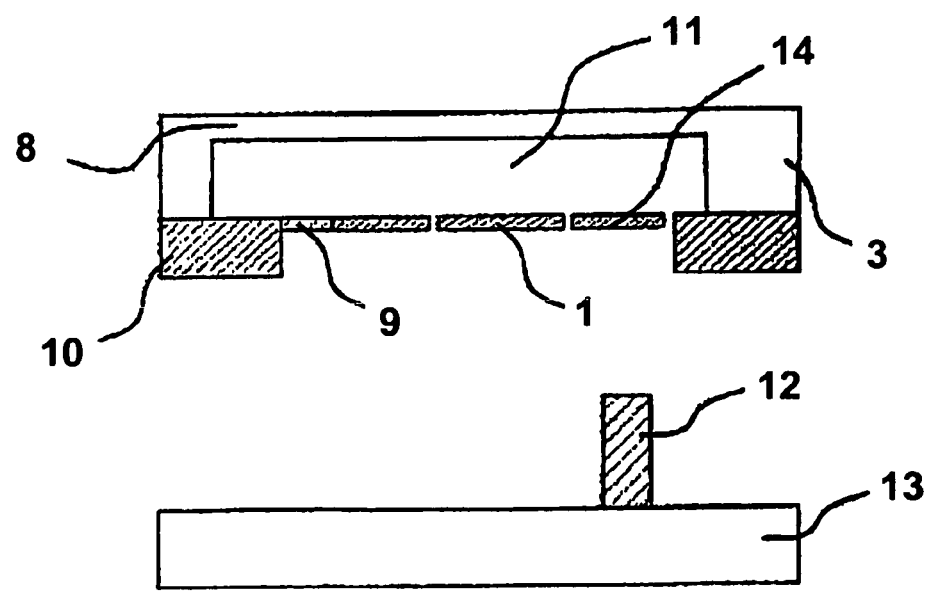

In FIG. 3, a section, restricted to a chip, of a silicon micromirror wafer which is encapsulated on the front side on the wafer plane and forms the frame chip with the chip frame 10 is represented in cross-section even before assembly of the carrier wafer. A carrier wafer with the carrier chip 13 illustrated thereunder, is configured here as a glass wafer. The raised base 12 is positioned on the glass wafer 13 such that it is situated, after adjustment of silicon micromirror wafer and glass wafer with the carrier chip 13, at the intended position below the frame 14 which surrounds the micromirror 1 or the microactuator 2.

Figure 4:
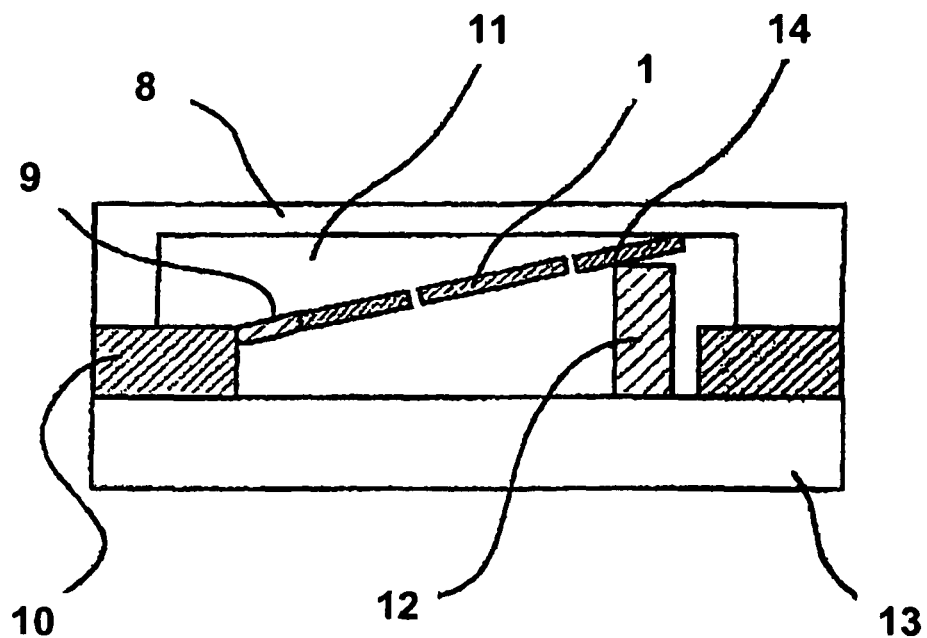

FIG. 4 shows how the raised base 12, after assembling the two wafers, tilts the frame 14 and hence also the microactuator and hence also the mirror plate 1 relative to the original position.

In FIG. 5, an advantageous embodiment of the frame 14 is represented. This frame 14 has, at at least one suitable position, a thickness which corresponds to the full wafer thickness. As can be seen in FIG. 6, a lower raised base 12 hence suffices to achieve, after assembly of micromirror wafer and the glass wafer forming the carrier chip 13, the same deflection as in the embodiment of FIGS. 3 and 4.

Figure 7:
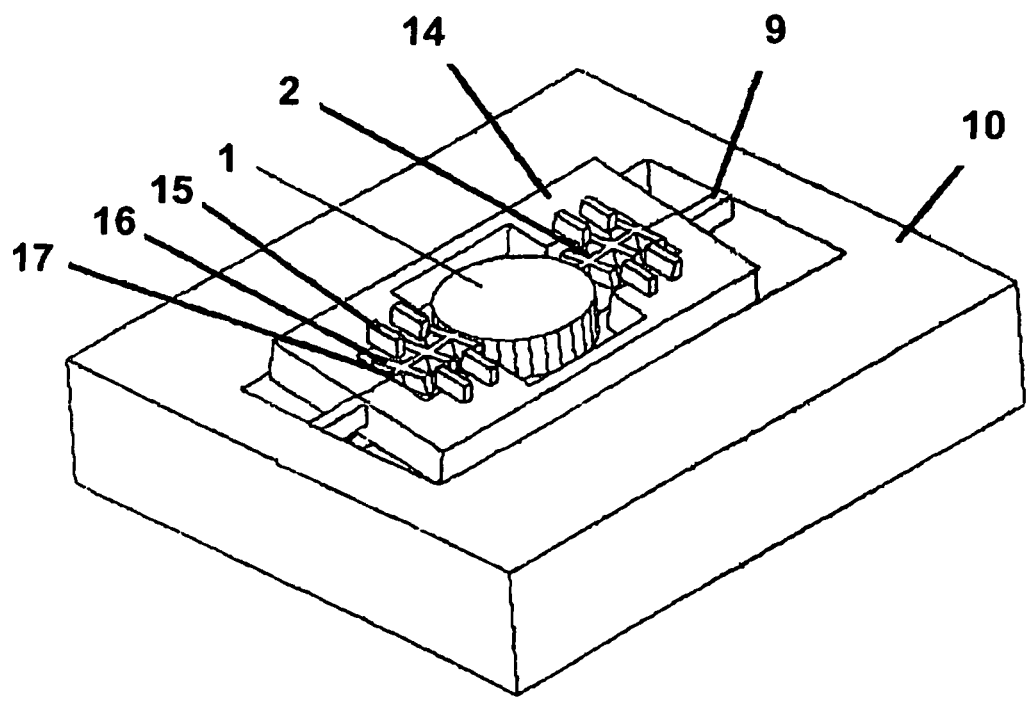

FIG. 7 shows a frame chip with a chip frame 10 and the microactuator 2, in which the micromirror 1 is suspended laterally on torsion springs 17. Connected to the moveable mirror plate of the micromirror 1 are also comb-like moveable drive electrodes 15 which, together with the oppositely situated static comb-like drive electrodes 16, form an electrostatic drive of the microactuator 2. The torsion springs 17 of the microactuator 2 end in the moveable frame 14 which, for its part, is suspended, via a suspension 9 formed by spring elements, moveably in the rigid chip frame 10. FIG. 7 shows this frame 14 in pretilted form. At the same time the micromirror 1—to be understood here as moment absorber—is deflected in the opposite direction.

Figure 8:
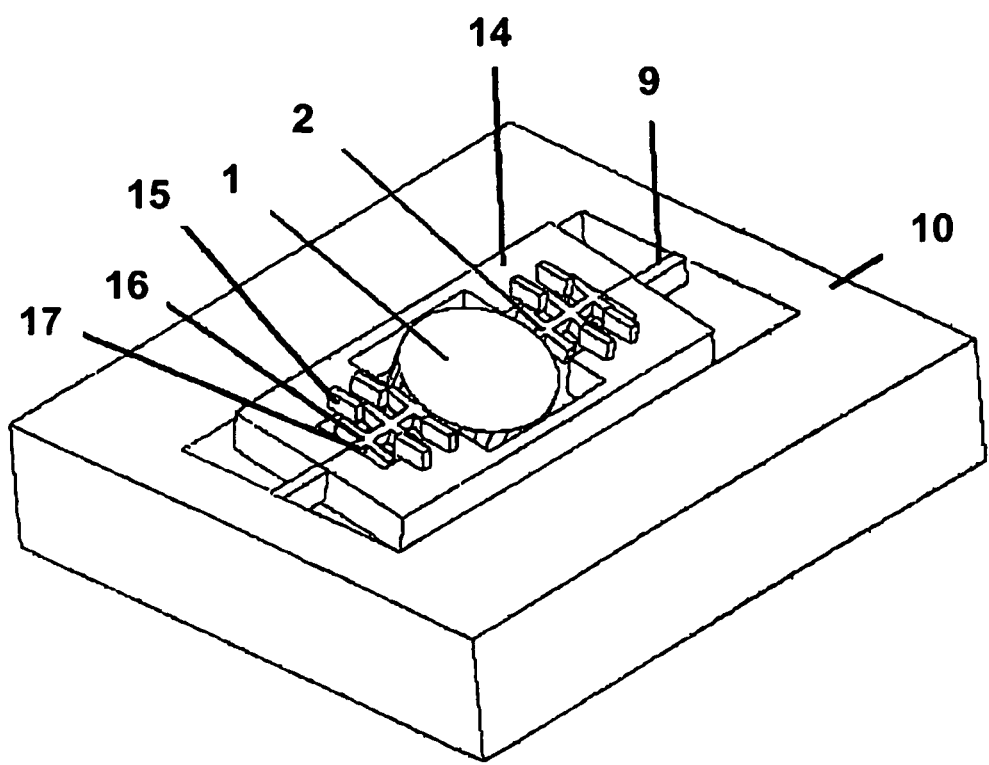

FIG. 8 shows the same frame chip as in FIG. 7, likewise with pretilted frame 14, but here as moment absorber of the deflected micromirror 1, the deflection direction of which corresponds to the pretilting direction of the frame 14.

Figure 9:
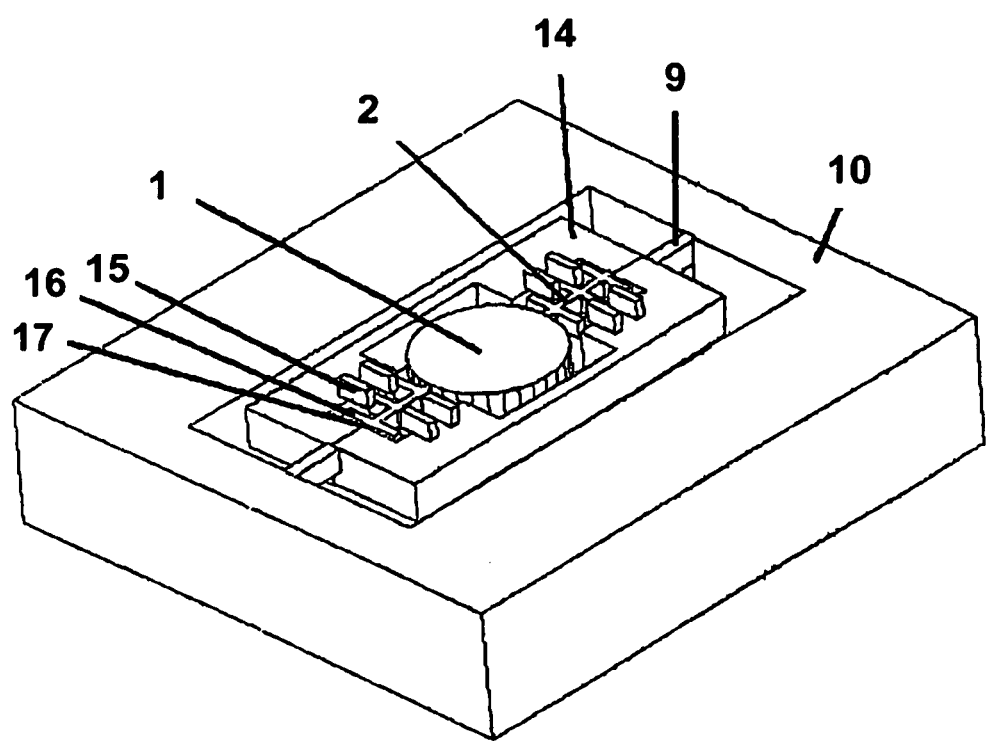

FIG. 9 shows in turn the same frame chip with the chip frame 10 and the microactuator 2 as in FIG. 7 but before tilting of the frame 14. The frame chip shown in FIGS. 7 to 9 forms, together with a cover 3 and a carrier chip 13 and disposed between these, an embodiment of a microsystem of the type proposed here.

All the features explained in the general part of the description can be produced in any sub-combinations, also in the microsystems shown in FIGS. 2 to 9 or in the microsystems formed from the parts illustrated there. These microreactors can be produced in particular with a method of the type described in the general part of the description.

The invention claimed is:

1. A microsystem comprising:
   a carrier chip having a closed surface;
   a frame chip disposed on the carrier chip;
   at least one micromirror;
   at least one micromirror actuator for pivoting the at least one micromirror about at least one axis out of a relaxed resting position; and
   a transparent cover disposed on the frame chip,
   wherein the frame chip comprises a first frame and a second frame, the first frame being arranged between the transparent cover and the closed surface of the carrier chip in a chip plane parallel to the closed surface of the carrier chip, wherein a closed cavity is formed within the first frame between the transparent cover and the closed surface of the carrier chip, the second frame being articulated pivotably on the first frame within the closed cavity, wherein the at least one micromirror is disposed within the second frame and articulated pivotably on the second frame about the at least one axis, a reflective surface of the micromirror facing towards the transparent cover, the second frame being pivoted permanently out of the chip plane so that the micromirror is tilted in its relaxed resting position by a non-zero angle relative to the closed surface of the carrier chip.

2. The microsystem according to claim 1, wherein the transparent cover has a window which is disposed above the at least one micromirror and has two plane-parallel surfaces which are orientated parallel to the chip plane.

3. The microsystem according to claim 1, wherein the second frame is retained by at least one base which is disposed between the closed surface of the carrier chip and the second frame in its position pivoted out of the chip plane.

4. The microsystem according to claim 1, wherein the non-zero angle is greater than a maximum deflection angle of the at least one micromirror out of the resting position.

5. The microsystem according to claim 1, wherein the non-zero angle is at least 2°.

6. The microsystem according to claim 1, wherein the second frame is pivoted out of the chip plane about a pivot axis which is orientated parallel to the axis or one of the axes about which the at least one micromirror is elastically pivotable.

7. The microsystem according to claim 1, wherein the at least one micromirror actuator has at least one rigid electrode comb which is disposed on the second frame, and at least one pivotable electrode comb which is connected to the micromirror.

8. The microsystem according to claim 1, wherein the at least one micromirror is connected to the second frame by at least one torsion spring.

9. The microsystem according to claim 1, wherein the second frame is connected to the first frame via an elastic suspension.

10. The microsystem according to claim 1, wherein the non-zero angle is at least 4°.

11. The microsystem according to claim 1, wherein the second frame is connected to the first frame via an elastic suspension that comprises at least one spiral spring.

12. The microsystem according to claim 1, wherein the second frame is connected to the first frame via an elastic suspension that comprises at least one torsional articulation.

13. A method for production of a microsystem, the method comprising:

producing, by structuring a frame chip, a first frame and a second frame, the second frame being disposed within the first frame and being articulated pivotably on the first frame, wherein at least one micromirror which can be pivoted about at least one axis elastically is disposed in the second frame and articulated pivotably on the second frame about the at least one axis such that the micromirror can be actuated by at least micromirror actuator;

connecting the first frame on one side to a transparent cover such that a reflective surface of the micromirror is facing towards the transparent cover;

connecting a carrier chip to the first frame on a side situated opposite the transparent cover such that the first frame is arranged between the transparent cover and a closed surface of the carrier chip, a closed cavity being formed within the first frame between the transparent cover and the closed surface of the carrier chip, the closed cavity containing the second frame and the micromirror; and pivoting the second frame, during or before closure of said cavity of the microsystem, permanently out of a chip plane defined by the first frame and being parallel to the closed surface of the carrier chip so that the micromirror obtains a relaxed resting position tilted relative to the closed surface of the carrier chip by a non-zero angle.

14. The method according to claim 13, wherein the second frame is pivoted out of the chip plane by at least one base which is disposed on the closed surface of the carrier chip.

15. The method according to claim 14, wherein the carrier chip or the frame chip is provided by structuring with the at least one base.

16. The method according to claim 13, wherein at least one of the carrier chip and the frame chip and the transparent cover are manufactured on the basis respectively of one wafer on which at the same time further microsystems are produced, the wafer being separated when the microsystem is closed by connecting the frame chip to the transparent cover.

\* \* \* \* \*

UNITED STATES PATENT AND TRADEMARK OFFICE
CERTIFICATE OF CORRECTION

PATENT NO.       : 8,526,098 B2                                      Page 1 of 1
APPLICATION NO.  : 12/669333
DATED            : September 3, 2013
INVENTOR(S)      : Hofmann et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 567 days.

Signed and Sealed this
Fifteenth Day of September, 2015

Michelle K. Lee
*Director of the United States Patent and Trademark Office*